United States Patent
Komine et al.

(10) Patent No.: US 9,885,960 B2
(45) Date of Patent: Feb. 6, 2018

(54) PATTERN SHAPE ADJUSTMENT METHOD, PATTERN SHAPE ADJUSTMENT SYSTEM, EXPOSURE APPARATUS, AND RECORDING MEDIUM

(71) Applicant: TOSHIBA MEMORY CORPORATION, Minato-ku (JP)

(72) Inventors: Nobuhiro Komine, Nagoya (JP);
Kazuya Fukuhara, Suginami-ku (JP);
Kazuo Tawarayama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 971 days.

(21) Appl. No.: 14/196,380

(22) Filed: Mar. 4, 2014

(65) Prior Publication Data

US 2015/0183059 A1    Jul. 2, 2015

Related U.S. Application Data

(60) Provisional application No. 61/920,896, filed on Dec. 26, 2013.

(51) Int. Cl.
*G03F 7/20* (2006.01)
*G06F 19/00* (2011.01)

(52) U.S. Cl.
CPC ...... *G03F 7/70575* (2013.01); *G03F 7/70616* (2013.01)

(58) Field of Classification Search
CPC .................. G03F 7/70575; G03F 7/70616
(Continued)

(56) References Cited

U.S. PATENT DOCUMENTS 6,163,559 A * 12/2000 Watson ............... G02B 5/1828
                                                        372/102
6,529,531 B1 * 3/2003 Everage ............ G03F 7/70333
                                                        372/20
(Continued)

FOREIGN PATENT DOCUMENTS

JP       6-69107       3/1994
JP       10-172887     6/1998
(Continued)

OTHER PUBLICATIONS

Dahotre et al., "Laser Fabrication and Machining of Materials", Springer, 2008, 565pg.*

(Continued)

*Primary Examiner* — Ryan Coyer
(74) *Attorney, Agent, or Firm* — Oblon, McClelland, Maier & Neustadt, L.L.P.

(57) ABSTRACT

In a pattern shape adjustment method according to one embodiment, a correspondence relation between a first shape feature amount of a first on-substrate pattern formed on a first substrate and a first laser band width of laser light as exposure light used when forming the first on-substrate pattern is acquired. Also, a second shape feature amount of a second on-substrate pattern actually formed on a second substrate is measured. Then, a second laser band width according to the shape of a third on-substrate pattern to be formed on a third substrate is calculated based on the correspondence relation and the second shape feature amount. Further, the third substrate is exposed to laser light having the second laser band width.

10 Claims, 5 Drawing Sheets

(58) Field of Classification Search
USPC .......................................................... 700/166
See application file for complete search history.

(56) References Cited

U.S. PATENT DOCUMENTS

| | | | |
|---|---|---|---|
| 6,545,746 B1 * | 4/2003 | Nishi | G03F 7/70891 355/30 |
| 6,862,023 B1 * | 3/2005 | Shaikh | G06T 17/10 345/420 |
| 7,817,247 B2 | 10/2010 | De Kruif et al. | |
| 8,089,613 B2 | 1/2012 | De Kruif et al. | |
| 2011/0010124 A1 * | 1/2011 | Wegmann | G01B 5/003 702/105 |
| 2011/0102757 A1 | 5/2011 | Butler et al. | |
| 2012/0057144 A1 | 3/2012 | De Kruif et al. | |
| 2013/0030773 A1 * | 1/2013 | O'Hare | G06F 17/50 703/1 |
| 2013/0342819 A1 * | 12/2013 | Takeshita | G03F 7/70616 355/67 |

FOREIGN PATENT DOCUMENTS

| | | |
|---|---|---|
| JP | 2006-179937 | 7/2006 |
| JP | 2007-142052 | 6/2007 |
| JP | 2011-97056 | 5/2011 |

OTHER PUBLICATIONS

Perry et al., "Ultrashort-pulse laser machining of dielectric materials", American Institute of Physics, Journal of Applied Physics vol. 85 Iss. 9, 1999, 9pg.*

* cited by examiner

PATTERN SHAPE ADJUSTMENT METHOD, PATTERN SHAPE ADJUSTMENT SYSTEM, EXPOSURE APPARATUS, AND RECORDING MEDIUM

CROSS-REFERENCE TO RELATED APPLICATIONS

This application is based upon and claims the benefit of priority from U.S. Provisional Application No. 61/920,896, filed on Dec. 26, 2013; the entire contents of which are incorporated herein by reference.

FIELD

Embodiments described herein relate generally to a pattern shape adjustment method, a pattern shape adjustment system, an exposure apparatus, and a recording medium.

BACKGROUND

In these years, as circuit patterns used in semiconductor devices are becoming finer, dimension accuracy in the lithography process is becoming one of especially important things. To date, various techniques to improve the dimension accuracy have been proposed. One of them is the method which adjusts the band width of laser light. Here, the depth of field (DOF) for patterns is expressed by $DOF=(k_2 \times \lambda)/NA^2$, where NA is the numerical aperture of the lens, $\lambda$ is the light source wavelength, and $k_2$ is a process factor.

As seen from this formula, the light source wavelength affects the magnitude of the depth of field. Hence, generally in the lithography process, laser light having a narrow band width close to being a single wavelength is used.

Meanwhile, the above formula can also be read as meaning that by changing the band width of the laser light, the contrast of a subject pattern can be changed. Hence, the band width of laser light may be used as a means of adjusting dimension differences between patterns due to an optical proximity effect.

However, by this method, on-substrate patterns having desired two-dimensional shapes cannot be formed with high accuracy. Hence, it is desired to form on-substrate patterns having desired two-dimensional shapes with high accuracy.

DETAILED DESCRIPTION

According to an embodiment, a pattern shape adjustment method is provided. In the pattern shape adjustment method, correspondence relation information denoting a correspondence relation between a first shape feature amount of a first on-substrate pattern formed on a first substrate and a first laser band width of laser light as exposure light used when forming the first on-substrate pattern is acquired. Also, a second shape feature amount of a second on-substrate pattern actually formed on a second substrate is measured. Then, a second laser band width according to a shape of a third on-substrate pattern to be formed on a third substrate is calculated based on the correspondence relation information and the second shape feature amount. Further, the third substrate is exposed to laser light having the second laser band width, thereby forming the third on-substrate pattern.

The pattern shape adjustment method, the pattern shape adjustment system, the exposure apparatus, and the recording medium according to the embodiment will be described in detail below with reference to the accompanying drawings. The present invention is not limited to this embodiment.

Embodiment

Figure 1:
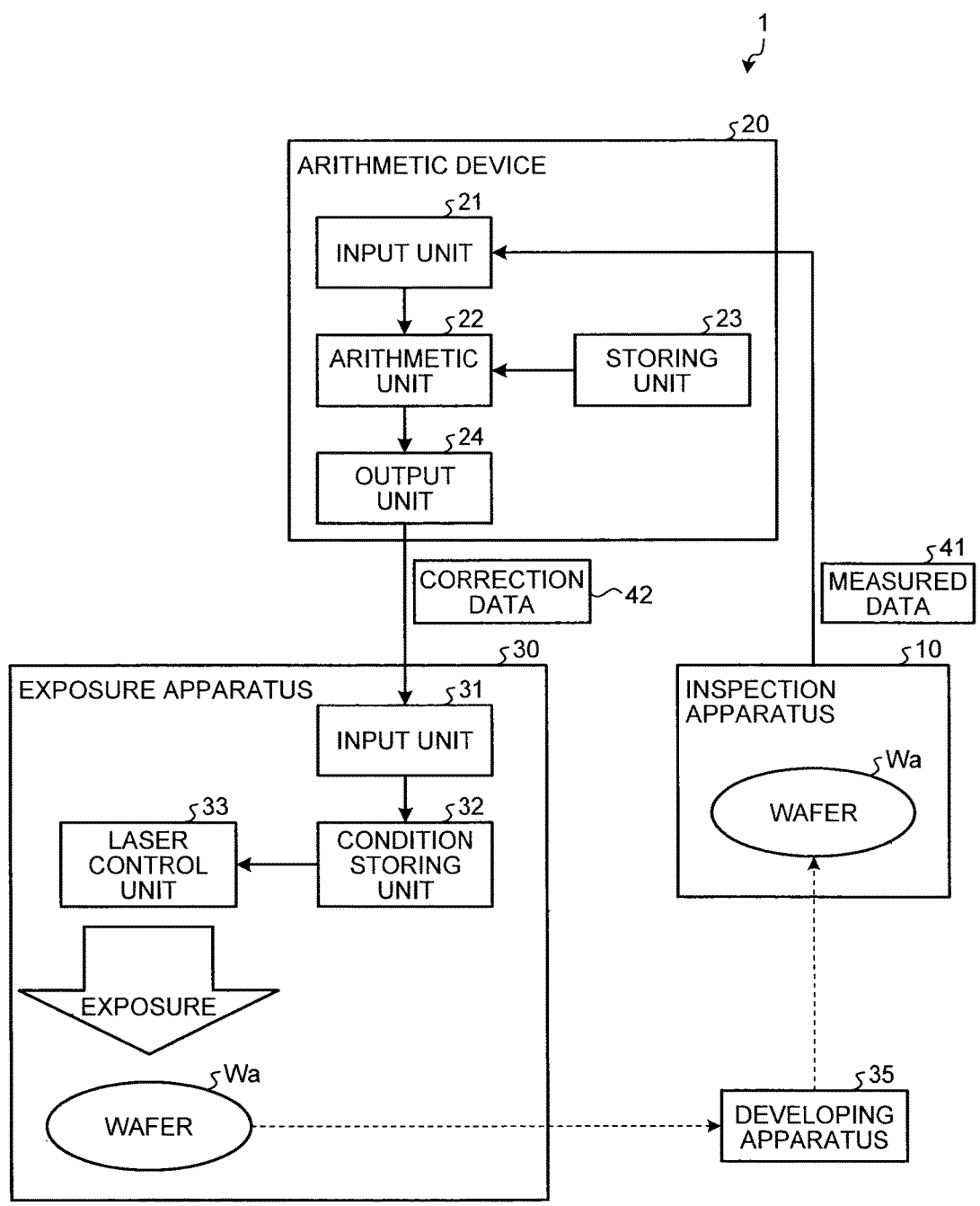
FIG. 1 is a diagram showing the configuration of the pattern shape adjustment system according to an embodiment.

FIG. 1 is a diagram showing the configuration of the pattern shape adjustment system according to the embodiment. The pattern shape adjustment system 1 is a system which forms on-substrate patterns having desired two-dimensional shapes on substrates to be processed (wafers Wa) such as semiconductor substrates. The shape of an on-substrate pattern formed by the pattern shape adjustment system 1 is, for example, a hole pattern or pillar pattern. Specifically, the shape of an on-substrate pattern is a circle, an ellipse, a polygon having at least four vertexes (e.g., a square or rectangle), etc., in a top view of the wafer Wa.

The on-substrate pattern may have any rotation angle in a top view of the wafer Wa. For example, the on-substrate pattern may be in an inclined ellipse or rectangle shape.

In the optical lithography process, the pattern shape adjustment system 1 of the present embodiment adjusts the band width of laser light (laser band width) to be at an appropriate value, thereby forming a pattern shape having an arbitrary shape feature amount on the wafer Wa. The shape feature amount of a pattern shape is roundness (ellipticity), the aspect ratio of sides, the ratio of inclined sides, the ratio of diagonal dimensions, or the like. The case where the pattern shape adjustment system 1 forms a circle pattern having desired roundness on the wafer Wa will be described below.

The pattern shape adjustment system 1 comprises an inspection apparatus 10, an arithmetic device 20, an exposure apparatus 30, and a developing apparatus 35. The exposure apparatus 30 performs exposure on the wafer Wa using laser light. The exposure apparatus 30 of the present embodiment corrects the laser band width of the laser light used in exposure, thereby correcting the roundness of the pattern to be formed on the wafer Wa. The wafer Wa exposed in the exposure apparatus 30 is transferred to the developing apparatus 35. The developing apparatus 35 performs development on the wafer Wa. The wafer Wa developed in the developing apparatus 35 is transferred to the inspection apparatus 10.

The inspection apparatus 10 measures six or more positions (edge positions) on the circumference of the pattern (a hole pattern) formed on the wafer Wa. Also, the inspection apparatus 10 measures the distance from an arbitrary reference point (such as an origin) to each edge position. For example, the inspection apparatus 10 measures dimensions of at least two different directions passing through the center of the pattern formed on the wafer Wa when measuring the distance from a reference point to each edge position. Hereinafter, a pattern to be measured by the inspection apparatus 10 from among patterns formed on the wafer Wa is called an inspection pattern. The inspection apparatus 10 sends the measured positions on the inspection pattern and the distances from the reference point as measured data 41 to the arithmetic device 20.

The arithmetic device 20 is a computer or the like that calculates the roundness of the inspection pattern based on the measured data 41. The arithmetic device 20 of the present embodiment calculates a correction value for the laser band width (a band width correction value) for the inspection pattern based on the correspondence relation between the laser band width and the roundness (correspondence relation information) derived beforehand. The arithmetic device 20 compares the correspondence relation information and calculated roundness, thereby calculating the band width correction value. The band width correction value calculated by the arithmetic device 20 is sent as correction data 42 to the exposure apparatus 30. Thus, the exposure apparatus 30 performs exposure using the correction data 42.

The arithmetic device 20 comprises an input unit 21, an arithmetic unit 22, a storing unit 23, and an output unit 24. The measured data 41 that is the inspecting result of the inspection apparatus 10 is input to the input unit 21. The storing unit 23 is a memory or the like that stores correspondence relation information that denotes the correspondence relation between the laser band width and the roundness. The correspondence relation information may be calculated by the arithmetic unit 22 or an external device other than the arithmetic device 20.

The arithmetic unit 22 calculates the roundness of the inspection pattern based on the measured data 41. Specifically, the arithmetic unit 22 calculates the roundness of the inspection pattern based on six or more edge positions of the inspection pattern and the distance from a reference point to each edge position. Further, the arithmetic unit 22 compares the correspondence relation information and the calculated roundness, thereby calculating the correction data 42 that is a band width correction value. The output unit 24 sends the correction data 42 to the exposure apparatus 30.

The exposure apparatus 30 comprises an input unit 31, a condition storing unit 32, and a laser control unit 33. The correction data 42 that is the computing result of the arithmetic device 20 is input to the input unit 31. The condition storing unit 32 is a memory or the like that stores exposure recipes. The condition storing unit 32 stores the correction data 42 together with an exposure recipe.

The laser control unit 33 controls exposure for the wafer Wa using the exposure recipe and the correction data 42. The exposure apparatus 30 performs exposure on wafers Wa on a per lot basis. An exposure recipe is set for each type of wafer Wa (for each lot). Thus, the exposure apparatus 30 adjusts the laser band width for each exposure recipe and then performs exposure for each lot.

Figure 2:
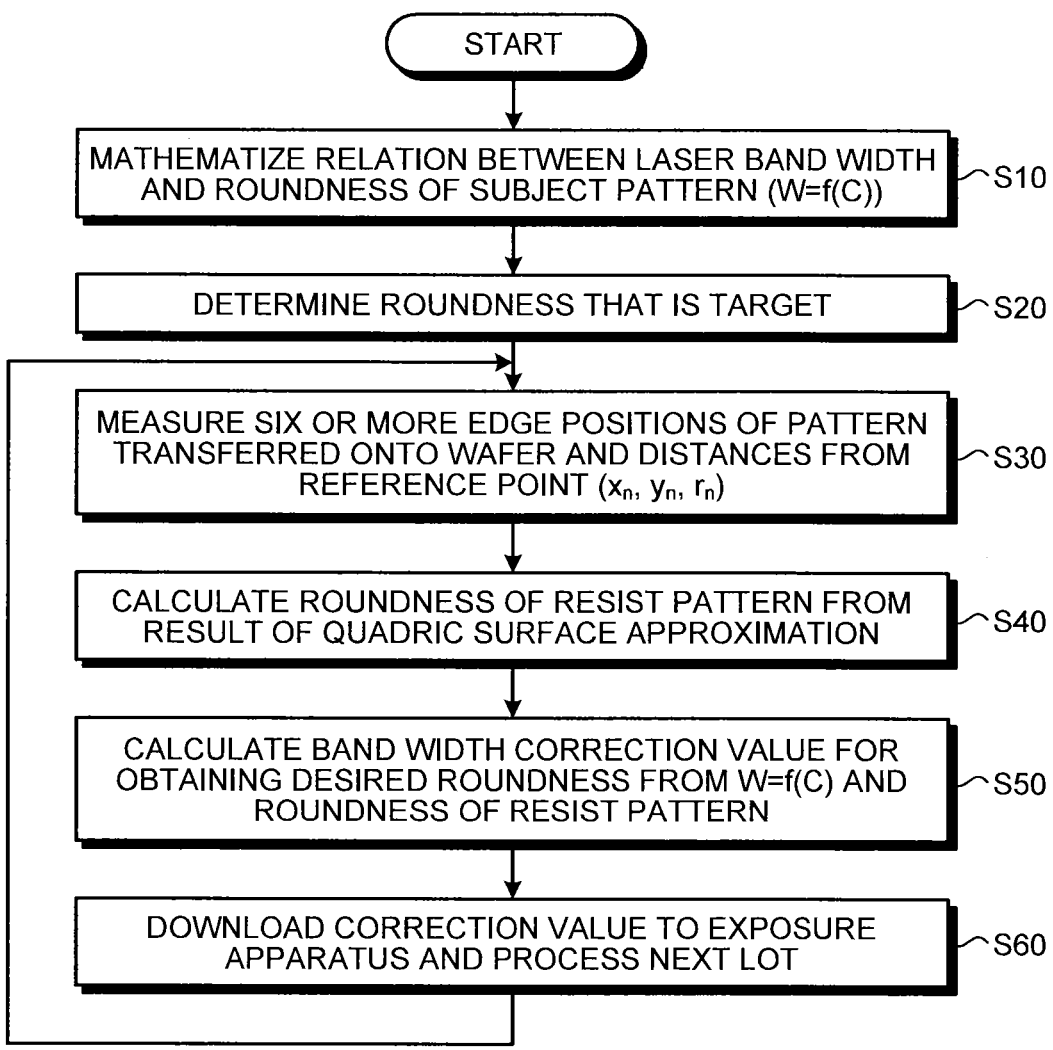
FIG. 2 is a flow chart showing the process procedure of the pattern shape adjustment system according to the embodiment.

Next, the process procedure of the pattern shape adjustment system 1 according to the embodiment will be described. FIG. 2 is a flow chart showing the process procedure of the pattern shape adjustment system according to the embodiment.

The pattern shape adjustment system 1 derives the correspondence relation information denoting the correspondence relation between the laser band width when an inspection pattern was formed on the wafer Wa and the roundness of this inspection pattern. The correspondence relation information is, for example, what a correspondence relation is mathematized to. This correspondence relation information is expressed by W=f(c), where C is roundness and W is the laser band width (step S10).

This correspondence relation information may be derived based on the results of executing a pattern formation simulation for the wafer Wa or by actually forming a pattern on a test wafer. The correspondence relation information may be set for each exposure apparatus or for each model of exposure apparatus. Or the correspondence relation information may be set for each specified exposure condition (the type of photomask or an exposure recipe) for use in exposure.

Further, the inspection pattern may be a resist pattern or an etched pattern obtained by etching through the resist pattern. Yet further, the inspection pattern may be a pattern exclusive for inspection or an actual circuit pattern.

Figure 3:
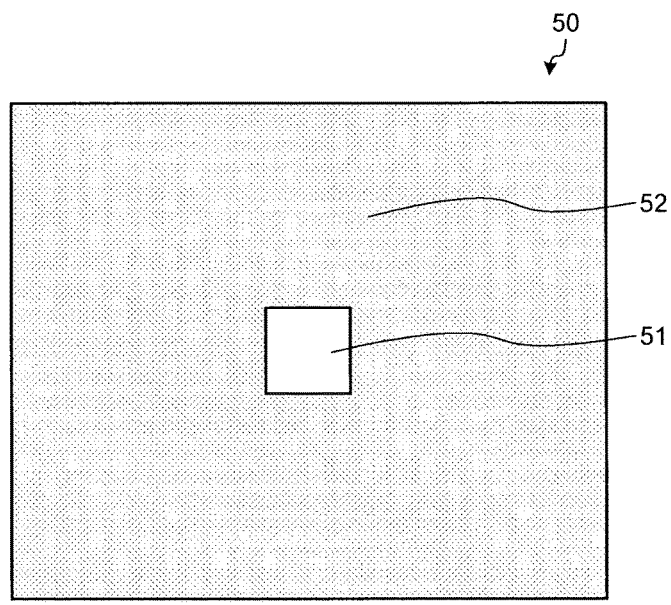
FIG. 3 is a diagram showing an example of the mask pattern corresponding to an inspection pattern.

Here, the mask pattern for the inspection pattern will be described. FIG. 3 is a diagram showing an example of the mask pattern corresponding to the inspection pattern. A mask pattern 50 corresponding to an inspection pattern has an opening 51 and a light-shield portion 52. The light-shield portion 52 blocks laser light that is exposure light, and the opening 51 allows laser light to pass through. The resist on the wafer Wa is exposed with use of this mask pattern 50, and thereby the pattern is transferred into a resist pattern (inspection pattern) of a hole shape on the wafer Wa.

When the correspondence relation information is derived, the roundness may be obtained using multiple types of mask patterns 50 or using a single type of mask pattern 50. The mask pattern is not limited to an isolated pattern having only one opening 51, but may be an array-like pattern having multiple openings 51 arranged.

Figure 4:
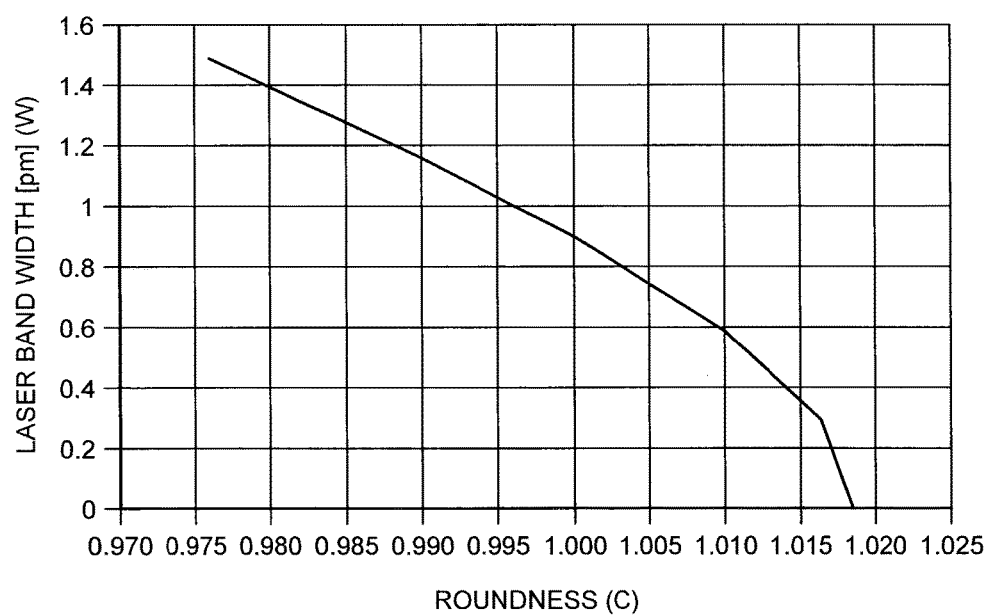
FIG. 4 is a graph for explaining correspondence relation information.

FIG. 4 is a graph for explaining the correspondence relation information. The horizontal axis of FIG. 4 represents the roundness (C), and the vertical axis represents the laser band width (W). When exposure to laser light having a predetermined laser band width is performed, an inspection pattern having predetermined roundness is formed. FIG. 4 shows the correspondence relation between the laser band width and the roundness present at this time. The correspondence relation information is what the relation shown in FIG. 4 is mathematized to.

After the correspondence relation information in the form of a mathematical formula is derived, this correspondence relation information is stored in the storing unit 23 of the arithmetic device 20. The roundness that is a target (adjustment target) is input to the input unit 21 by a user or the like. The roundness that is the target is stored in the storing unit 23. Because the desired shape feature amount (roundness or the like) is different for each step (layer) of pattern formation, the roundness that is the target is set for each step.

The arithmetic unit 22 determines the roundness that is a target for the inspection pattern according to instructions from a user (step S20). The inspection apparatus 10 measures edge positions of the inspection pattern and the distance of each edge position from a reference point.

Figure 5:
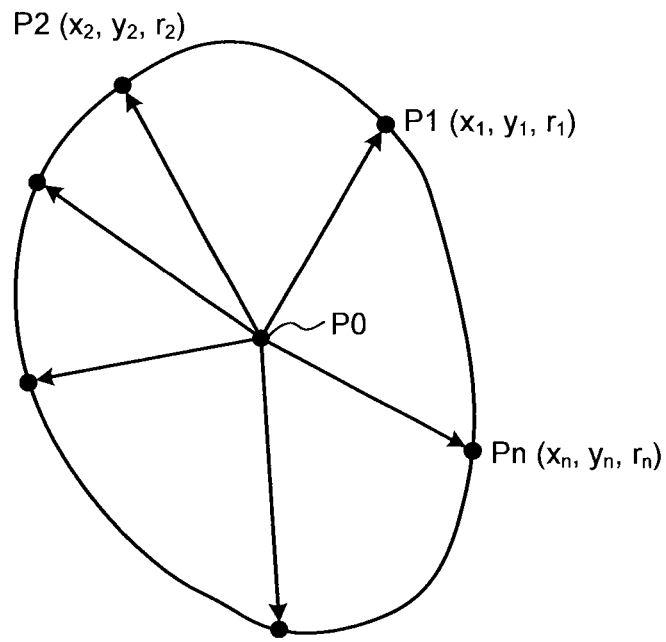
FIG. 5 is a diagram for explaining the distance from a reference point to each edge position.

FIG. 5 is a diagram for explaining the distance from a reference point to each edge position. The inspection apparatus 10 sets an arbitrary position in the area where the inspection pattern is formed as a reference point P0. The inspection apparatus 10 sets, e.g., a position near the center of the inspection pattern as the reference point P0.

Further, the inspection apparatus 10 sets edge positions P1 to Pn (n is a natural number greater than or equal to six) on the inspection pattern. Then, the inspection apparatus 10 calculates the coordinates of edge positions $P1(x_1, y_1)$ to Pn($x_n$, $y_n$) and the distances $r_1$ to $r_n$ from edge positions P1 to Pn to the reference point P0.

In FIG. 5, the location of edge position P1 and the distance to the reference point P0 are denoted by ($x_1$, $y_1$, $r_1$), and the location of edge position P2 and the distance to the reference point P0 are denoted by ($x_2$, $y_2$, $r_2$). Also, in FIG. 5, the location of edge position Pn and the distance to the reference point P0 are denoted by ($x_n$, $y_n$, $r_n$). In this way, the inspection apparatus 10 measures six or more edge positions of the pattern transferred onto the wafer Wa and the distances from the reference point ($x_n$, $y_n$, $r_n$), where n=1 to 6 or greater (step S30).

The inspection apparatus 10 sends the measuring results for edge positions P1 to Pn as measured data 41 to the arithmetic device 20. In the arithmetic device 20, the edge positions are input via the input unit 21 and stored in the storing unit 23.

The arithmetic unit 22 calculates the roundness of the inspection pattern based on the measured data 41. Specifically, the arithmetic unit 22 substitutes sets of measuring results ($x_n$, $y_n$, $r_n$), where n=1 to 6, into the equation $r_n = ax_n^2 + bx_n y_n + cy_n^2 + dx_n + ey_n + f$ and determines the coefficients a, b, c, d, e, f. Further, the arithmetic unit 22 rotates the axis direction of the minor axis (or major axis) to be parallel or perpendicular to the coordinate axes so that cross terms (terms of xy) are eliminated and then arranges the shape of the inspection pattern to the form $$\frac{(x-m)^2}{M} + \frac{(y-n)^2}{N} = 1$$

to obtain roundness N/M.

In other words, the arithmetic unit 22 calculates the roundness of the resist pattern from the result of quadric surface approximation (step S40). Then, the arithmetic unit 22 compares the correspondence relation information (W=f(C)) and the calculated roundness, thereby calculating a band width correction value (correction data 42) for obtaining desired roundness (step S50). As such, the arithmetic unit 22 calculates a band width correction value according to the shape of a resist pattern to be formed.

Figure 6:
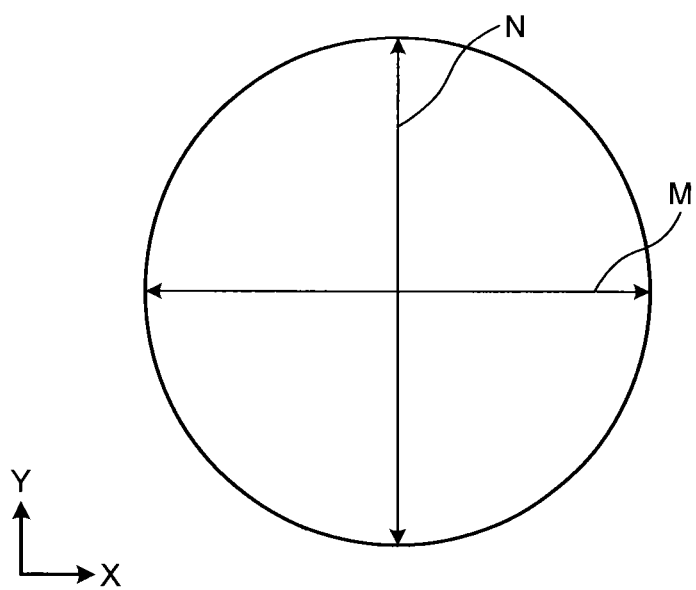
FIG. 6 is a diagram for explaining the roundness of the inspection pattern.

FIG. 6 is a diagram for explaining the roundness of the inspection pattern. Letting M be the dimension along the X direction of the inspection pattern and N be the dimension along the Y direction, N/M denotes the roundness. The arithmetic unit 22 obtains the roundness N/M for the inspection pattern.

Here, the case where with an isolated hole pattern being set as the inspection pattern, the roundness is adjusted to be at 1 will be described. If the correspondence relation between the laser band width and the roundness of the inspection pattern demonstrates the characteristic shown in FIG. 4, the relational expression between the laser band width W and the roundness C is as follows:

$$W = -494.9C^2 + 954.86C - 459.04$$

For example, if the calculating result for the roundness (N/M)=C is at 1.015, the arithmetic unit 22 can derive 0.30 pm as the current laser band width from W=f(C). Further, the arithmetic unit 22 can derive 0.92 pm as the laser band width necessary to adjust the roundness to be at 1 from W=f(C). The arithmetic unit 22 subtracts 0.30 pm that is the current laser band width from 0.92 pm that is the necessary laser band width, thereby outputting 0.92−0.3=0.62 as correction data 42.

The output unit 24 downloads the correction data 42 calculated by the arithmetic unit 22 to the exposure apparatus 30. The exposure apparatus 30 corrects the laser band width using the correction data 42 and then performs exposure for the next lot (step S60). The pattern shape adjustment system 1 repeats the process of steps S30 to S60 for each lot. By this means, the resist patterns of each lot become more averaged little by little.

The arithmetic unit 22 may calculate the correction data 42 for each specified exposure condition (the type of photomask or an exposure recipe). In this case, the exposure apparatus 30 corrects the laser band width using the correction data 42 for each specified exposure condition and then performs exposure.

Here, the exposure apparatus 30 adjusts the laser band width to be 0.92 pm using 0.62 as the correction data 42 and then performs exposure for the subsequent lot. As a result, the roundness of the inspection pattern of the subsequent lot was at 0.999.

As such, the pattern shape adjustment system 1 adjusts the two-dimensional feature amount of the resist pattern formed on the wafer Wa by adjusting the laser band width. Although in the present embodiment the case where the pattern shape adjustment system 1 comprises the developing apparatus 35 has been described, the pattern shape adjustment system 1 does not need to comprise the developing apparatus 35.

The pattern shape adjustment system 1 may perform the process of steps S10 to S30 described with reference to FIG. 2 in any order. Although the pattern shape adjustment system 1 calculates the correction data 42 from only one result data (the roundness of one inspection pattern), it may calculate the correction data 42 based on a plurality of data, taking into account the measurement reproducibility of measured dimension data, the setting accuracy of the laser band width, and the like. In this case, the pattern shape adjustment system 1 calculates the correction data 42 using data obtained by, e.g., taking a moving average of a plurality of data.

Although in the present embodiment the case where the correction data 42 is calculated based on six or more edge positions on the inspection pattern has been described, data to be used to calculate the correction data 42 may be about four or five edge positions on the inspection pattern.

Although in the present embodiment the case where the inspection pattern is circular, the inspection pattern may be rectangular. In this case, the shape of the inspection pattern is expressed by $e^{x^2-2Bx} + e^{y^2-2Cy} = 2e^{A^2}$, where coefficients A, B, C are arbitrary real numbers.

When a semiconductor device (semiconductor integrated circuit) is manufactured, for example, adjustment of the pattern shape by the pattern shape adjustment system 1 is repeated, e.g., for each layer during the wafer process. Specifically, after a layer to be processed is formed on a wafer Wa, the exposure apparatus 30 exposes the wafer Wa coated with a resist through a photomask. At this time, the exposure apparatus 30 adjusts the laser band width using the correction data 42. Then, the developing apparatus 35 develops the wafer Wa to form a resist pattern on the wafer Wa.

Then, the inspection apparatus 10 obtains the measured data 41 about the wafer Wa, and the arithmetic device 20 calculates the correction data 42 to be used in exposure for the next lot using the measured data 41. Then, the arithmetic device 20 inputs the correction data 42 to the exposure apparatus 30.

The wafer Wa after development is etched by an etching apparatus. At this time, the etching apparatus etches the layer being processed with the resist pattern as a mask. By this means, an actual pattern corresponding to the resist pattern is formed on the wafer Wa. When a semiconductor device is manufactured, the above film formation of a layer to be processed, exposure, development, measurement of the measured data 41, calculation of the correction data 42, etching, and so on are repeated for each layer.

Figure 7:
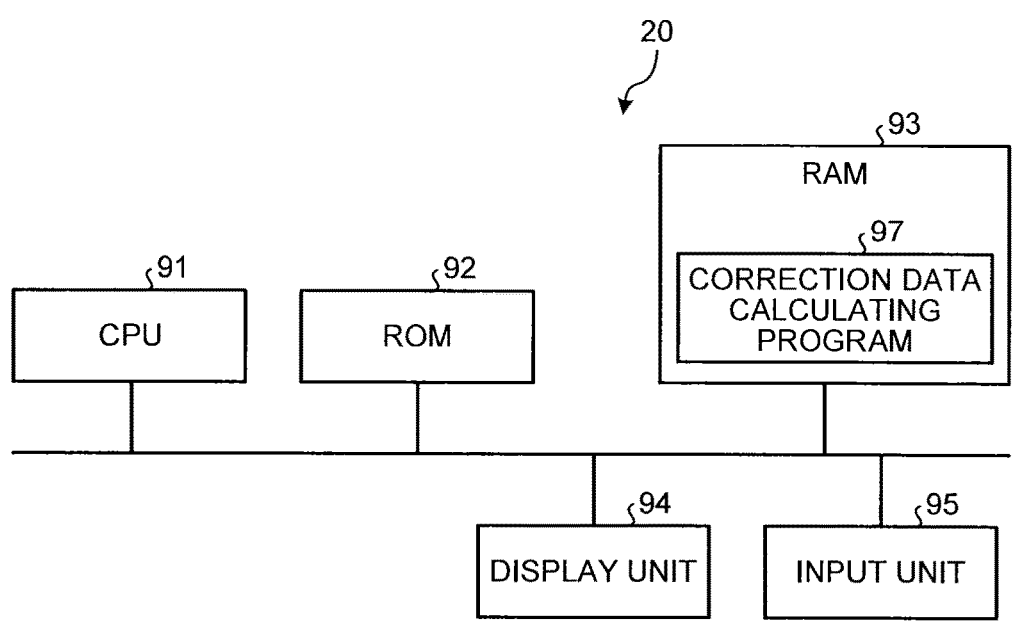
FIG. 7 is a diagram showing the hardware configuration of an arithmetic device.

Next, the hardware configuration of the arithmetic device 20 will be described. FIG. 7 is a diagram showing the hardware configuration of the arithmetic device. The arithmetic device 20 comprises a CPU (Central Processing Unit) 91, a ROM (Read Only Memory) 92, a RAM (Random Access Memory) 93, a display unit 94, and an input unit 95. In the arithmetic device 20, the CPU 91, ROM 92, RAM 93, display unit 94, and input unit 95 are connected via a bus line.

The CPU 91 calculates the correction data 42 using a correction data calculating program 97 that is a computer program. The correction data calculating program 97 is a computer program product having a non-transitory computer-readable recording medium containing a plurality of instructions, which can be executed by a computer, for calculating the correction data 42. The plurality of instructions of the correction data calculating program 97 have a computer perform calculation of the correction data 42. The display unit 94 is a display device such as a liquid crystal monitor and displays the measured data 41, the inspection pattern, the correspondence relation information, the correction data 42, and the like according to instructions from the CPU 91. The input unit 95 comprises a mouse and a keyboard, and instruction information (parameters and the like necessary for calculation of the correction data 42) entered externally by a user is inputted thereto. The instruction information inputted to the input unit 95 is sent to the CPU 91.

The correction data calculating program 97 is stored in the ROM 92 and loaded into the RAM 93 via the bus line. FIG. 7 shows the state where the correction data calculating program 97 is loaded in the RAM 93.

The CPU 91 executes the correction data calculating program 97 loaded in the RAM 93. Specifically, in the arithmetic device 20, according to instructions entered by a user via the input unit 95, the CPU 91 reads out the correction data calculating program 97 from the ROM 92 and spreads it in the program storing area in the RAM 93 to perform various processes. The CPU 91 temporarily stores a variety of data produced in the various processes in the data storing area formed in the RAM 93.

The correction data calculating program 97 executed in the arithmetic device 20 is configured with modules including the arithmetic unit 22, and these are loaded onto a main memory and created on the main memory.

As such, according to the embodiment, because the laser band width is adjusted based on the correspondence relation between the shape feature amount of the pattern shape and the laser band width, on-substrate patterns having desired two-dimensional shapes can be formed with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern shape adjustment method, comprising:
calculating a second laser band width according to a shape of a third circle pattern to be formed on a third substrate based on correspondence relation information and on a second roundness of a second circle pattern actually formed on a second substrate, the correspondence relation information denoting a correspondence relation between a first roundness of a first circle pattern formed on a first substrate and a first laser band width of laser light as exposure light used when forming the first circle pattern; and
forming the third circle pattern by exposing the third substrate to laser light having the second laser band width, wherein:
the second roundness is derived based on a plurality of edge positions of the second circle pattern and a distance of each of the edge positions from a reference point,
the second circle pattern is approximated by a quadric surface function $r_n = ax_n^2 + bx_n y_n + cy_n^2 + dx_n + ey_n + f$, where $(x_n, y_n)$ denotes the edge position, a, b, c, d, e, and f denote coefficients, and $r_n$ denotes the distance of the edge position from the reference point, and
the first and second roundnesses are expressed by a quotient of N divided by M when the quadric surface function is arranged as $$\frac{(x-m)^2}{M} + \frac{(y-n)^2}{N} = 1.$$

2. The pattern shape adjustment method according to claim 1, wherein:
the correspondence relation information is set for each of exposure recipes, each of the exposure recipes being a recipe used for exposure when applying the exposure light onto the first substrate coated with a resist, and
the second laser band width is calculated for each of the exposure recipes.

3. The pattern shape adjustment method according to claim 1, wherein the correspondence relation information is derived through a pattern formation simulation of formation of the first circle pattern on the first substrate or an experiment in which the first circle pattern is actually formed on the first substrate.

4. The pattern shape adjustment method according to claim 1, wherein the plurality of edge positions are six or more edge positions.

5. The pattern shape adjustment method according to claim 1, wherein:
the correspondence relation information is information that is set for each of exposure apparatuses or each model of the exposure apparatuses, which applies exposure light onto the second substrate when forming the second circle pattern, and
the second laser band width is calculated for each of the exposure apparatuses or each model of the exposure apparatuses.

6. A pattern shape adjustment system, comprising:
an arithmetic device that calculates a second laser band width according to a shape of a third circle pattern to be formed on a third substrate based on correspondence relation information and on a second roundness of a second circle pattern actually formed on a second substrate, the correspondence relation information denoting a correspondence relation between a first roundness of a first circle pattern formed on a first substrate and a first laser band width of laser light as exposure light used when forming the first circle pattern;

an inspection apparatus that measures shape information about a shape of the second circle pattern; and an exposure apparatus that applies exposure light onto the second substrate when forming the second circle pattern and that applies exposure light onto the third substrate when forming the third circle pattern, wherein:

the exposure apparatus exposes the third substrate to laser light having the second laser band width, the inspection apparatus measures, as the shape information, a plurality of edge positions of the second circle pattern and a distance of each of the edge positions from a reference point, the arithmetic device calculates the second roundness based on the shape information, the second circle pattern is approximated by a quadric surface function $r_n = ax_n^2 + bx_n y_n + cy_n^2 + dx_n + ey_n + f$, where $(x_n, y_n)$ denotes the edge position, a, b, c, d, e, and f denote coefficients, and $r_n$ denotes the distance of the edge position from the reference point, and the first and second roundnesses are expressed by a quotient of N divided by M when the quadric surface function is arranged as $$\frac{(x-m)^2}{M} + \frac{(y-n)^2}{N} = 1.$$

7. The pattern shape adjustment system according to claim 6, wherein:

the correspondence relation information is set for each of exposure recipes, each of the exposure recipes being a recipe used for exposure when applying the exposure light onto the first substrate coated with a resist, and the arithmetic device calculates the second laser band width for each of the exposure recipes.

8. The pattern shape adjustment system according to claim 6, wherein the correspondence relation information is derived through a pattern formation simulation of formation of the first circle pattern on the first substrate or an experiment in which the first circle pattern is actually formed on the first substrate.

9. The pattern shape adjustment system according to claim 6, wherein the plurality of edge positions are six or more edge positions.

10. The pattern shape adjustment system according to claim 6, wherein the correspondence relation information is information that is set for each of the exposure apparatuses or each model of the exposure apparatuses, which applies exposure light onto the second substrate when forming the second circle pattern, and the second laser band width is calculated for each of the exposure apparatuses or each model of the exposure apparatuses.

* * * * *